United States Patent
Yuan et al.

(10) Patent No.: US 8,954,913 B1
(45) Date of Patent: Feb. 10, 2015

(54) METHODS OF GENERATING CIRCUIT LAYOUTS THAT ARE TO BE MANUFACTURED USING SADP ROUTING TECHNIQUES AND VIRTUAL NON-MANDREL MASK RULES

(71) Applicant: GLOBALFOUNDRIES Inc., Grand Cayman (KY)

(72) Inventors: Lei Yuan, Cupertino, CA (US); Soo Han Choi, Pleasanton, CA (US); Jongwook Kye, Pleasanton, CA (US); Harry J. Levinson, Saratoga, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/043,251

(22) Filed: Oct. 1, 2013

(51) Int. Cl.
*G06F 17/50* (2006.01)

(52) U.S. Cl.
CPC ........ *G06F 17/5081* (2013.01); *G06F 17/5077* (2013.01)
USPC .............................. 716/126; 716/55; 716/139

(58) Field of Classification Search
CPC .................................. G06F 17/50; G06F 15/04
USPC ............................................................ 716/126
See application file for complete search history.

(56) References Cited

U.S. PATENT DOCUMENTS 8,563,425 B2 * 10/2013 Schultz .......................... 438/637

* cited by examiner

*Primary Examiner* — Thuan Do
(74) *Attorney, Agent, or Firm* — Amerson Law Firm, PLLC

(57) ABSTRACT

One method disclosed herein involves, among other things, generating a set of mandrel mask rules, block mask rules and a virtual, software-based non-mandrel-metal mask. The method also includes creating a set of virtual non-mandrel mask rules that is a replica of the mandrel mask rules, generating a set of metal routing design rules based upon the mandrel mask rules, the block mask rules and the virtual non-mandrel mask rules, generating the circuit routing layout based upon the metal routing design rules, decomposing the circuit routing layout into a mandrel mask pattern and a block mask pattern, generating a first set of mask data corresponding to the mandrel mask pattern, and generating a second set of mask data corresponding to the block mask pattern.

12 Claims, 17 Drawing Sheets

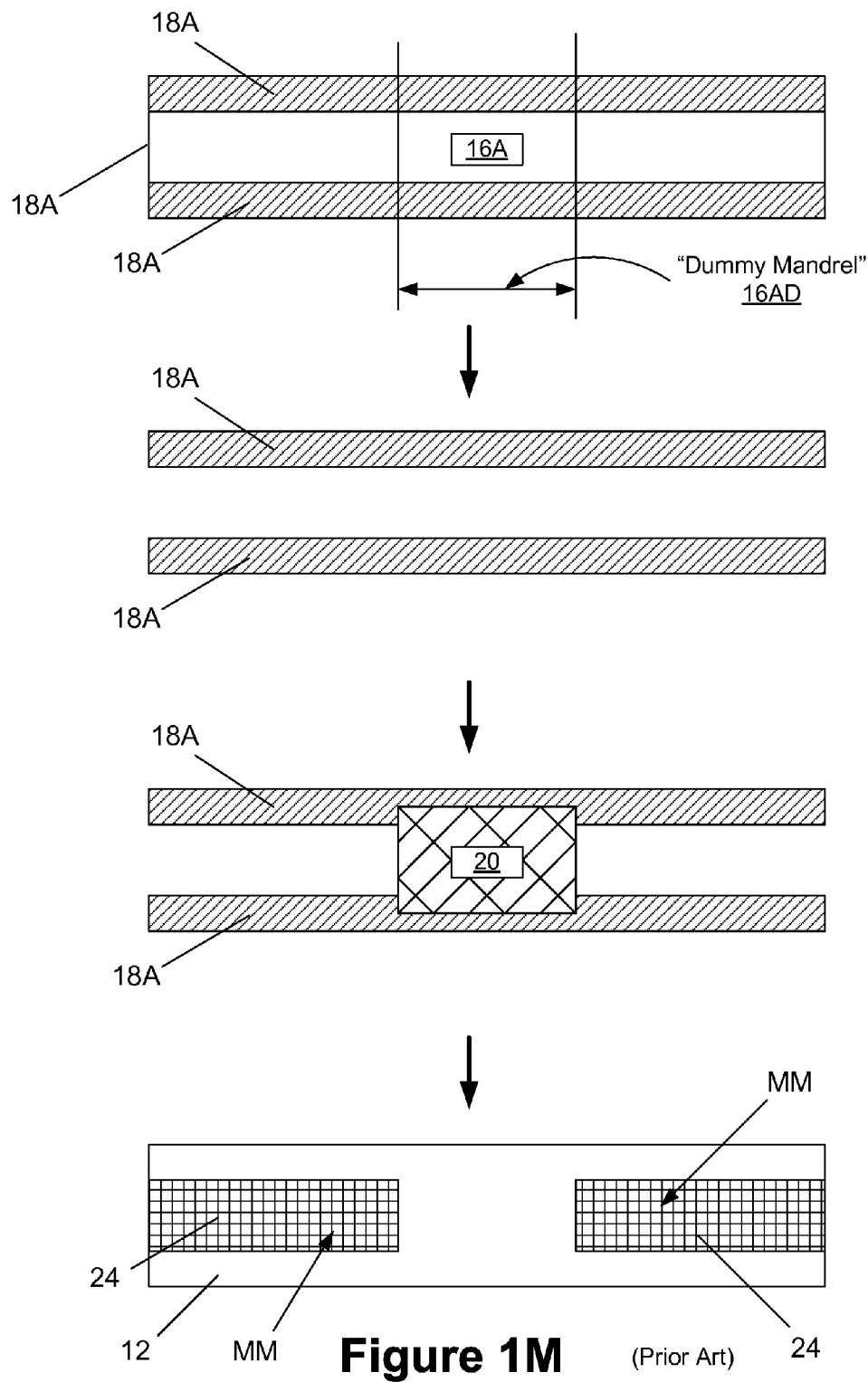

METHODS OF GENERATING CIRCUIT LAYOUTS THAT ARE TO BE MANUFACTURED USING SADP ROUTING TECHNIQUES AND VIRTUAL NON-MANDREL MASK RULES

BACKGROUND OF THE INVENTION

1. Field of the Invention

Generally, the present disclosure relates to the manufacture of sophisticated semiconductor devices, and, more specifically, to various methods of generating circuit layouts that are to be formed using self-aligned double patterning (SADP) routing techniques.

2. Description of the Related Art

Photolithography is one of the basic processes used in manufacturing integrated circuit products. At a very high level, photolithography involves: (1) forming a layer of light or radiation-sensitive material, such as photoresist, above a layer of material or a substrate; (2) selectively exposing the radiation-sensitive material to a light generated by a light source (such as a DUV or EUV source) to transfer a pattern defined by a mask or reticle (interchangeable terms as used herein) to the radiation-sensitive material; and (3) developing the exposed layer of radiation-sensitive material to define a patterned mask layer. Various process operations, such as etching or ion implantation processes, may then be performed on the underlying layer of material or substrate through the patterned mask layer.

Of course, the ultimate goal in integrated circuit fabrication is to faithfully reproduce the original circuit design on the integrated circuit product. Historically, the feature sizes and pitches employed in integrated circuit products were such that a desired pattern could be formed using a single patterned photoresist masking layer. However, in recent years, device dimensions and pitches have been reduced to the point where existing photolithography tools, e.g., 193 nm wavelength photolithography tools, cannot form a single patterned mask layer with all of the features of the overall target pattern. Accordingly, device designers have resorted to techniques that involve performing multiple exposures to define a single target pattern in a layer of material. One such technique is generally referred to as multiple patterning, e.g., double patterning. In general, double patterning is an exposure method that involves splitting (i.e., dividing or separating) a dense overall target circuit pattern into two separate, less-dense patterns. The simplified, less-dense patterns are then printed separately on a wafer utilizing two separate masks (where one of the masks is utilized to image one of the less-dense patterns, and the other mask is utilized to image the other less-dense pattern). Further, in some cases, the second pattern is printed in between the lines of the first pattern such that the imaged wafer has, for example, a feature pitch which is half that found on either of the two less-dense masks. This technique effectively lowers the complexity of the photolithography process, improving the achievable resolution and enabling the printing of far smaller features that would otherwise be impossible using existing photolithography tools. The SADP process is one such multiple patterning technique. The SADP process may be an attractive solution for manufacturing next-generation devices, particularly metal routing lines on such next-generation devices, due to better overlay control that is possible when using an SADP process.

As noted above, the integrated circuit design is eventually fabricated by transferring the circuit layout to a semiconductor substrate in a series of layers that collectively will form the features that constitute the devices that make up the components of the integrated circuit. However, before the layout can be fabricated, a validation process of the layout must take place. Layout designers use very sophisticated Electronic Design Automation (EDA) tools and programs when designing circuit layouts for modern integrated circuit products. As it relates to double patterning techniques, an overall target pattern must be what is referred to as double-patterning-compliant. In general, this means that an overall target pattern is capable of being decomposed into two separate patterns that each may be printed in a single layer using existing photolithography tools. Layout designers sometimes speak of such patterns with reference to "colors," wherein the first mask will be represented in the EDA tool using a first color and the second mask will be represented in the EDA tool using a second, different color. To the extent a layout is non-double-patterning-compliant, it is sometimes stated to present a "coloring conflict" between the two masks. An overall target pattern may have many regions or areas that cannot be printed because the features in those regions are spaced too closely to one another for existing photolithography tools to be able to print such closely spaced features as individual features. To the extent an overall target pattern has an even number of such features, such a pattern is sometimes referred to as an "even cycle" pattern, while an overall target pattern that has an odd number of such features is sometimes referred to as an "odd cycle" pattern. Even cycle patterns can be formed using double patterning techniques, while odd cycle patterns cannot be formed using double patterning techniques.

FIGS. 1A-1K depict one illustrative example of a device 10 wherein an illustrative prior art SADP process was performed to form metal features, e.g., metal lines, in a layer of insulating material 12. With reference to FIG. 1A, a hard mask layer 14 is formed above the layer of insulating material 12 and a layer of mandrel material 16 was formed above the hard mask layer 14. Also depicted is a patterned layer of photoresist material 17, typically referred to as a "mandrel mask," that was formed above the layer of mandrel material 16 using traditional, single exposure photolithography tools and techniques. The layer of mandrel material 16 may be comprised of a material that may be selectively etched with respect to the hard mask layer 14.

Next, as shown in FIG. 1B, an etching process is performed on the layer of mandrel material 16 while using the patterned layer of photoresist material 17 as an etch mask. This etching process results in the formation of a plurality of mandrels 16A. In the depicted example, the mandrels 16A are formed so as to have a pitch 16P and a minimum width 16W. The pitch 16P and the width 16W may vary depending upon the particular device 10 under construction. FIG. 1C depicts the device 10 after the patterned layer of photoresist 17, i.e., the mandrel mask, has been removed.

Next, as shown in FIG. 1D, a layer of spacer material 18 was deposited on and around the mandrels 16A by performing a conformal deposition process. The layer of spacer material 18 should be a material that may be selectively etched relative to the mandrels 16A and the hard mask layer 14. FIG. 1E depicts the device 10 after an anisotropic etching process was performed on the layer of spacer material 18 to define a plurality of sidewall spacers 18A, having a lateral width 18W, positioned adjacent the mandrels 16A. The width 18W of the spacers 18A may vary depending upon the particular device 10 under construction. Next, as shown in FIG. 1F, the mandrels 16A are removed by performing an etching process that is selective relative to the hard mask layer 14 and the sidewall spacers 18A.

FIG. 1G depicts the device 10 after a patterned photoresist mask 20, a so-called block mask, is formed above the layer of spacers 18A and the hard mask layer 14. In one example, the block mask 20 may be formed using traditional, single exposure photolithography tools and techniques. FIG. 1H depicts the device 10 after an etching process has been performed to transfer the pattern defined by the combination (or union) of the sidewall spacers 18A and the block mask 20 to the hard mask layer 14. FIG. 1I depicts the device 10 after one or more process operations were performed to remove the sidewall spacers 18A and the block mask 20 from above the now-patterned hard mask layer 14. Next, as shown in FIG. 1J, an etching process was performed on the layer of insulating material 12 through the patterned hard mask 14 to define illustrative trenches 22 in the layer of insulating material 12. FIG. 1K depicts the device 10 after schematically depicted metal features 24, e.g., metal lines, were formed in the trenches 22 and after the patterned hard mask layer 14 was removed. The manner in which such metal features 24 may be formed in the layer of insulating material 12 are well known to those skilled in the art.

In the SADP process, the metal features 24 that are formed are typically referred to as either "mandrel-metal" features ("MM") or "non-mandrel-metal" features ("NMM"). As depicted in FIG. 1K, the metal features 24 that are positioned under the location where the mandrels 16A and the features of the mandrel mask 17 (both shown in dashed lines in FIG. 1K) were located, are so-called "mandrel-metal" features—designated as "MM" in FIG. 1K. All of the other metal features 24 formed in the layer of insulating material 12 are "non-mandrel-metal" features—designated as "NMM" in FIG. 1K. As it relates to terminology, the MM features and NMM features are referred to as being different "colors" when it comes to decomposing an overall pattern layout that is intended to be manufactured using an SADP process, as will be described more fully below. Thus, two MM features are said to be of the "same color" and two NMM features are said to be of the "same color, while an MM feature and an NMM feature are said to be of "different colors."

Another important feature that is employed in SADP techniques is a so-called "dummy mandrel." FIGS. 1L-1M each include a sequence of drawings (top to bottom) that will be referenced to explain the concept of a dummy mandrel. The upper drawing in FIG. 1L depicts the device 10 after the original mandrels 16A and the spacers 18A have been formed as previously described. As discussed previously, mandrel-metal (MM) features are only formed below spaces previously occupied by a mandrel 16A.

In the cross-sectional view shown in FIG. 1L, mandrel 16A is a mandrel that occupies a space where a mandrel-metal (MM) feature 24 will be formed (see lower drawing) in the layer of insulating material 12, while the two other depicted mandrels 16AD are "dummy mandrels"—where there will be no mandrel-metal formed thereunder. Also depicted in the lower drawing in FIG. 1L is a non-mandrel-metal (NMM) feature 24 that is formed in the space defined by two adjacent spacers 18A. At the point in the process flow depicted in the middle drawing in FIG. 1L, all of the original mandrels 16A have been removed, leaving only the spaced-apart spacers 18A, and a block mask 20 has been formed that covers the area previously occupied by portions of the original mandrels 16A, thereby effectively converting portions of the original mandrels 16A that are now covered by the block mask 20 into "dummy mandrels" 16AD, which are shown in dashed lines in the middle drawing for explanation purposes. As will be understood from the foregoing, a dummy mandrel, e.g., mandrels 16AD in FIG. 1L, is a portion of an original mandrel 16A whose position is later covered by the block mask 20 after the original mandrel 16A has been removed. In the lower drawing in FIG. 1L dashed lines 24D depict the location where a mandrel-metal (MM) feature would have been formed if the block mask 20 did not block the areas previously occupied by the dummy mandrels 16AD.

FIG. 1M is a sequence of plan-view drawings schematically depicting some of the steps involved in forming two illustrative mandrel-metal features 24 (see bottom drawing) in the layer of insulating material 12. As depicted, the original mandrels 16A are typically line-type features that may be of any desired axial length. In some cases, the original mandrels 16A may be formed so as to exhibit a "jogged-line" configuration. In general, as discussed above, a "dummy mandrel" is a portion of the original mandrel 16A that is later covered by the block mask 20 after the original mandrel 16A has been removed. The upper drawing in FIG. 1M depicts the point in the process flow wherein the spacers 18A have been formed adjacent an illustrative original mandrel 16A. The next drawing in the sequence depicts the point in the process flow where the original mandrel 16A has been removed. The hard mask layer 14 is not depicted in FIG. 1M. The next drawing depicts the point in the process flow where the block mask 20 has been formed so as to cover a portion, but not all, of the space previously occupied by the original mandrel 16A. The bottom drawing depicts the device after the layer of insulating material 12 has been etched, the block mask 20 and spacers 18A have been removed, the mandrel-metal (MM) features 24 have been formed in the layer of insulating material 12 and after the hard mask 14 (not shown) has been removed. In this example, with reference to the upper drawing in FIG. 1M, the middle portion of the original mandrel 16A would be referred to as a "dummy mandrel," while the remaining portions of the original mandrel 16A are still referred to as "mandrels." That is, the block mask 20 is used to effectively "cut" what would otherwise become part of a mandrel-metal feature 24. The dummy mandrel patterns are traditionally generated by SADP decomposition software.

One well-known double patterning technique is referred to as LELE ("litho-etch-litho-etch") double patterning. As the name implies, the LELE process involves forming two photoresist etch masks and performing two etching processes to transfer the desired overall pattern to a hard mask layer that is then used as an etch mask to etch an underlying layer of material. With respect to terminology, the different masks employed in the LELE double patterning process are said to be different "colors." Thus, depending upon the spacing between adjacent features, the features may be formed using the same photoresist mask ("same color") or they may have to be formed using different photoresist masks ("different color"). In an LELE process, if two adjacent features are spaced apart by a distance that can be patterned using traditional single exposure photolithography, then those two adjacent features may be formed using the same ("same color") photoresist mask. In contrast, if the spacing between the two adjacent features is less than can be formed using single exposure photolithography, then those features must be either formed using different photoresist masks ("different color") or the spacing between the features must be increased by changing the circuit layout such that they may be formed using the same photoresist mask.

As noted above, any circuit layout to be formed using double patterning techniques must be checked to confirm that it can be decomposed into two separate photoresist masks. A layout must have zero odd-cycles to be decomposable in an LELE process. To determine if a circuit layout is double-patterning-compliant, a mask engineer, using very sophisticated and well-known EAD tools and computer programs, connects adjacent features by "drawing" a "polygon loop" that connects the centroid of the features under investigation. FIG. 1N contains a simplistic example of such a polygon loop 30 drawn for five (A-E) adjacent features. The polygon loop 30 is comprised of five edges 31. In this example, due to the relative spacing between adjacent features, all of the features are required to be formed using "different color" ("DC") masks. Thus, the polygon loop 30 has five "DC" edges connecting the various features. The polygon loop 30 represents an odd-cycle layout due to the odd number of DC edges (five total) in the polygon loop 30. Due to the odd number of DC edges in the polygon loop 30, the pattern reflected by the polygon loop 30 is not decomposable using double patterning techniques. FIG. 1O depicts one illustrative modification that may be made to the circuit layout to make it decomposable. In this example, the spacing between the features A and B is increased such that those two features may be formed using the "same color" (SC) mask. Thus, the modified polygon loop 30A now has only four DC edges—an even number—and it may be decomposed using double patterning techniques. In short, in the LELE double patterning process, increasing the spacing between the adjacent features has the effect of "breaking" the odd-cycle polygon loop. However, increasing the spacing between adjacent features has the negative effect of increasing the area or "plot space" of silicon needed to fabricate the circuit, and increasing such spacing may have a "ripple" effect, causing additional odd-cycles that will need to be resolved.

In the SADP process, just like with the LELE process, a layout must have zero odd-cycles to be decomposable. However, unlike the LELE process, due to the nature of the SADP process, merely increasing the spacing between adjacent features within an odd-cycle polygon loop such that the two adjacent features must be formed using the "same color" mask will not resolve an odd-cycle situation, i.e., such an increase in spacing will not break the odd-cycle loop in the SADP process. Rather, in the SADP process, the spacing between the two adjacent features must be increased by a sufficient magnitude such that the two adjacent features are spaced so far apart that they may be formed using either the mandrel mask or the block mask—i.e., the spacing must be increased to such an extent that the features are said to be "color insensitive." As before, increasing the spacing between adjacent features has the negative effect of increasing the area or "plot space" of silicon needed to fabricate the circuit, and increasing such spacing may have a "ripple" effect, causing additional odd-cycles that will need to be resolved by increasing the spacing between additional features.

As noted above, the integrated circuit design is eventually fabricated by transferring the circuit layout to a semiconductor substrate in a series of layers that collectively will form the features that constitute the devices that make up the components of the integrated circuit. However, before the layout can be fabricated, a validation process of the layout must take place. Design Rule Checking (DRC) is the area of electronic design automation that determines whether the physical layout of a particular chip layout satisfies a series of recommended parameters called design rules. Design rule checking is a major step during physical verification of the chip design. Design rules are a series of parameters provided by semiconductor manufacturers that enable the chip designer to verify the correctness of a product layout and the mask sets (reticle) used in manufacturing the product. Advanced processes and products may involve the use of more restrictive design rules in an effort to improve product yield.

Design rules may be specific to a particular semiconductor manufacturing process and/or product. In general, a design rule set specifies certain geometric and connectivity restrictions between features of the layout to ensure sufficient margins to account for variability in semiconductor manufacturing processes and to ensure that the circuits work as intended. Typically, there are several basic types of design rules that semiconductor manufacturers employ. The first are single layer rules, such as, for example, width rules, spacing rules and pitch rules. A width rule specifies the smallest allowable width of any shape in the design, i.e., the width of a metal line or a gate electrode structure. A spacing rule specifies the minimum distance between two adjacent features, like the spacing between two adjacent metal lines. Spacing rules can vary depending upon the nature of the relationship between the two adjacent features, e.g., corner-to-corner spacing, tip-to-side spacing, side-to-side spacing, tip-to-tip spacing, etc. The magnitude of the space allowed by these various spacing rules will likely not be the same in all situations, e.g., the allowable tip-to-tip spacing may be different from the allowable side-to-side spacing. Additionally, the magnitude of the allowed spacing will likely be tighter (smaller) for more advanced products and processes as compared to older product generations. These single layer rules will exist for each layer of a semiconductor product, with the lowest levels typically having the tightest or most restrictive design rules and the highest metal layers on the product typically having larger, less restrictive design rules. There is also what is known as two layer design rules. A two layer design rule specifies a relationship that must exist between features on two separate layers of the product. For example, an enclosure design rule might specify that an object of one type, such as a contact or via, must be covered, with some additional margin of error, by a metal layer. There are many other design rules that are not discussed herein.

Typically, the design validation process is handled by a computer-based verification tool, which processes a circuit layout and verifies that the layout adheres to a set of specified design rules. One such verification tool is sometimes referred to as a design rule checker. Often times the design rule checker is implemented as a stand-alone software program, such as Cadence Assura®DRC, or as a part of an electronic design automation tool, such as Cadence Virtuoso®. The design rule checker examines a layout for violations of a set of specified design rules. The layout is usually received by the design rule checker in the form of a file that digitally represents the layout of the circuit. Current formats for layout files include, but are not limited to, GDS II and OASIS. When a design rule checker observes a circuit feature within the layout that violates a particular design rule, the violation is flagged by the design rule checker. Examples of how this flagged violation can be brought to the designer's attention include, but are not limited to, marking the violation directly in a resulting output layout file or graphically bringing attention to the violation within the electronic design automation tool.

Design rule checking and double patterning checking are very computationally intense tasks. Usually, design rule checks will be run on each sub-section of a product to minimize the number of errors that are detected at the top level. If run on a single CPU, customers may have to wait up to a week to get the result of a design rule check for modern integrated circuit designs. Most design companies need to or would like to reduce the time involved in performing design rule checking/double patterning checking operations, i.e., it is desirable to achieve reasonable cycle times since design rule checking/double patterning checking operations will likely be performed several times prior to producing a final circuit layout that is both design-rule and double-patterning-compliant. With today's processing power, full-chip design rule checking/double patterning checking operations may be performed more quickly. Nevertheless, reducing the time involved in validating and correcting errors in a product layer such that the final product layout is design-rule-compliant and double-patterning-compliant is a highly desirable goal.

FIG. 2 depicts one illustrative example of a prior art metal routing process 50 that is performed using EDA tools for generating a circuit routing layout 58 that is intended to be manufactured using an SADP process. As shown in FIG. 2, the process begins with creating a set of mandrel mask rules, as indicated in block 52, and creating a set of block mask rules, as indicated in block 56. The mandrel mask rules and the block mask rules may be specific to a particular semiconductor manufacturing process and/or product. In general, mandrel mask rules and the block mask rules establish, among other things, certain size and spacing limitations as it relates to the formation of features on both the mandrel mask and the block mask, while accounting for the limitations in photolithography tools and techniques. With continuing reference to FIG. 2, based upon the mandrel mask rules and the block mask rules, a set of metal routing design rules are generated, as indicated in block 56. In general, the metal routing design rules set specifies certain geometric and spacing restrictions between adjacent features of the circuit layout, while accounting for variability in semiconductor manufacturing processes. Importantly, the metal routing design rules are generated and used to create the final circuit layout in an effort to insure that the final circuit layout can be decomposed into a mandrel mask and a block mask, each or which is compliant with the corresponding mask rules. With the metal routing rules established (in block 56), an EDA router is used to generate the circuit routing layout 58.

An ideal method of implementing a double patterning route would be a colorless routing method, wherein EDA Route software generates a metal layout without assigning color to metal route patterns and the decomposability of route layout is assured by enforcing zero odd cycle. The colorless route method is preferred over otherwise color route method because it does not require color assignment (decomposition) during routing process and is thus much more efficient. The colorless route method requires that the layout must have color symmetry. FIG. 3 depicts an example of such a color-symmetrical layout as it relates to an LELE double patterning process. The overall circuit layout consists of three features (A-C). In one coloring possibility ("Color Assignment 1"), the feature B is formed in mask A, while the features A and C are formed in mask B. In another coloring possibility ("Color Assignment 2"), the color assignment is flipped or reversed from Color Assignment 1, where the features A and C are formed in mask A, while the feature B is formed in mask B. The circuit design layout is said to be color symmetrical if both of the colored layouts in FIG. 3 have passed all required design rule checking or if both of the colored layouts fail the exact same design rule check. Color symmetry is naturally guaranteed for the LELE double patterning process where mask A and mask B are symmetrical.

However, due to the nature of the SADP process, such color symmetry is not guaranteed due to the nonsymmetrical design rules between mandrel-metal (MM) features and non-mandrel-metal (NMM) features. The non-color-symmetry of an SADP layout can also originate from prior art SADP decomposition solutions. FIG. 4A depicts an example of the non-color-symmetrical nature of the SADP process. In one SADP coloring possibility ("Color Assignment 1"), the feature B is a mandrel-metal (MM) feature, while the features A and C are non-mandrel-metal (NMM) features. In another SADP coloring possibility ("Color Assignment 2"), the features A and C are MM features, while the feature B is an NMM feature. Assuming that the spacing "S" (shown in the bottom drawing in FIG. 4A) between the mandrel-metal features A and C in the Color Assignment 2 solution is less than the minimum mandrel spacing rules, then the Color Assignment 2 solution is not DRC compliant. However, with respect to the Color Assignment 1 solution, the features A and C are non-mandrel-metal features and not subject to design rule checking of the minimum mandrel spacing rules, thus the Color Assignment 1 solution is DRC compliant, which is opposite to the Color Assignment 2. Therefore, the design layout herein is not color symmetrical according to prior art SADP design rules.

FIG. 4B depicts another example of the non-color-symmetrical nature of the SADP process that originates from decomposition solution. In one SADP coloring possibility ("Color Assignment 1"), the features A, C and E are NMM features, while the features B, D and F are MM features. To resolve mandrel patterning in the Color Assignment 1 routing, dummy mandrels (collectively referenced with the number 70) are formed to connect the closely spaced mandrel metals. The outline of the block mask 20 that will be used to prevent metal formation in the dummy mandrel region is depicted in dashed lines in FIG. 4B.

In another SADP coloring possibility ("Color Assignment 2"), the features A, C and E are MM features, while the features B, D and F are NMM features. To resolve mandrel patterning in the Color Assignment 2 routing, dummy mandrels (collectively referenced with the number 72) are formed to connect the closely separated mandrel metals. A block mask 20 is still in use to prevent metal formation in the dummy mandrel region. As depicted, the configurations of the areas occupied by the dummy mandrels 70, 72 that are formed to resolve the design layout are not the same.

With continuing reference to FIG. 4B, the block mask 20 is depicted as having an ideal rectangular configuration. However, when actually manufactured, the block mask 20 will typically not have this idealized rectangular configuration. For example, FIG. 4B also includes a dashed line that depicts an example of the configuration of an as-manufactured real-world block mask 20R that has rounded corners as compared to the theoretical configuration of the rectangular shaped block mask 20. The general oval-shaped configuration of the real-world block mask 20R is also individually depicted in FIG. 4B for clarity purposes. Accordingly, due to differences between the theoretical and real-world configuration of the block mask and the fact that the features A-F will also suffer some "distortion" as compared to the idealized shape of those features, the Color Assignment 1 routing depicted in FIG. 4B may not pass design rule checks. For example, due to the "corner rounding" in both block mask 20 and mandrel feature F, there is unanticipated metal feature formed in the dummy mandrel region that will result in a violation of the spacing requirement between the features E and F. On the other hand, the design layout under Color Assignment 2 can be manufactured with the decomposition result shown. More importantly, the SADP design layout herein is not color symmetrical because of the non-symmetrical decomposition solutions, more specifically, dummy mandrel formation.

Thus, using prior art SADP techniques, the formation of colorless circuits using colorless SADP routing method was not possible. This is problematic for several reasons. First, colored routing solutions require very time-consuming decomposition-coloring conflict resolution processes. Additionally, coloring-dependent decomposition of circuit layouts typically results in unintended coloring-dependent performance variations in the resulting integrated circuit product.

The present disclosure is directed to various methods of generating circuit layouts that are to be formed using self-aligned double patterning (SADP) routing techniques which may solve or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of generating circuit layouts that are to be formed using self-aligned double patterning (SADP) routing techniques. In one embodiment, a method disclosed herein includes, among other things, generating a set of mandrel mask rules, generating a set of block mask rules, generating a virtual, software-based non-mandrel-metal mask, creating a set of virtual non-mandrel mask rules, generating a set of metal routing design rules based upon the mandrel mask rules, the block mask rules and the virtual non-mandrel mask rules and generating the circuit routing layout based upon the metal routing design rules.

Another illustrative method disclosed herein includes, among other things, generating a set of mandrel mask rules, generating a set of block mask rules, generating a virtual, software-based non-mandrel-metal mask, creating a set of virtual non-mandrel mask rules, wherein the virtual non-mandrel mask rules comprise a replica of the mandrel mask rules, generating a set of metal routing design rules based upon the mandrel mask rules, the block mask rules and the virtual non-mandrel mask rules, generating the circuit routing layout based upon the metal routing design rules, decomposing the circuit routing layout into a mandrel mask pattern and a block mask pattern, generating a first set of mask data corresponding to the mandrel mask pattern, and generating a second set of mask data corresponding to the block mask pattern.

Another illustrative method disclosed herein includes, among other things, decomposing a circuit layout into a mandrel mask pattern, a block mask pattern and a dummy non-mandrel pattern, after decomposing the circuit routing layout, performing at least one design rule checking activity on each of the mandrel mask pattern, the block mask pattern and the dummy non-mandrel pattern, generating a first set of mask data corresponding to the mandrel mask pattern, and generating a second set of mask data corresponding to the block mask pattern.

BRIEF DESCRIPTION OF THE DRAWINGS

The disclosure may be understood by reference to the following description taken in conjunction with the accompanying drawings, in which like reference numerals identify like elements, and in which:

FIGS. 1A-1M depict one illustrative example of a prior art SADP process;

Figure 1A:
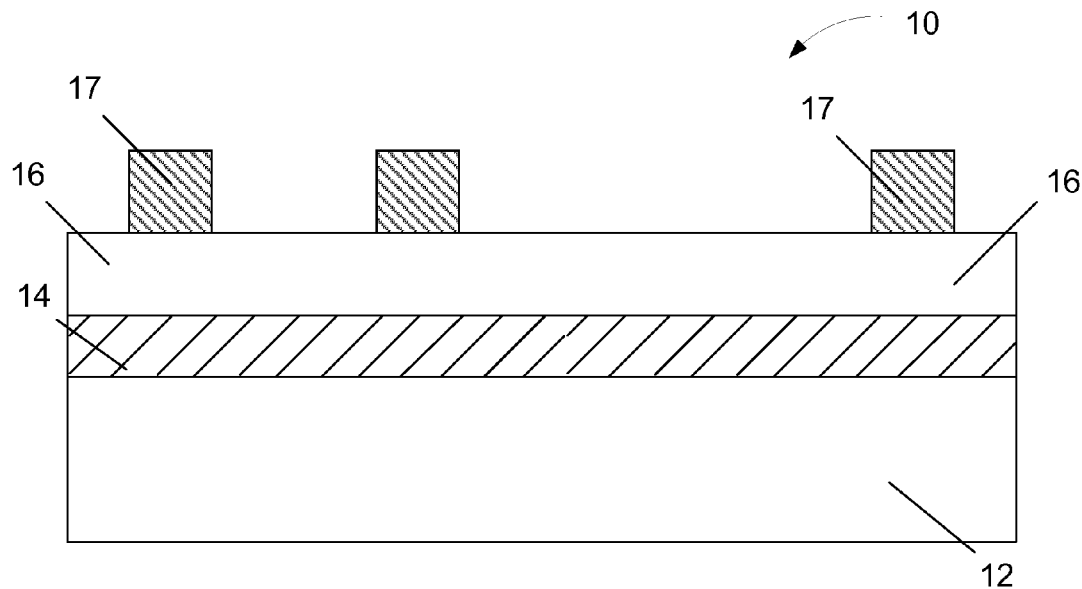
Figure 1B:
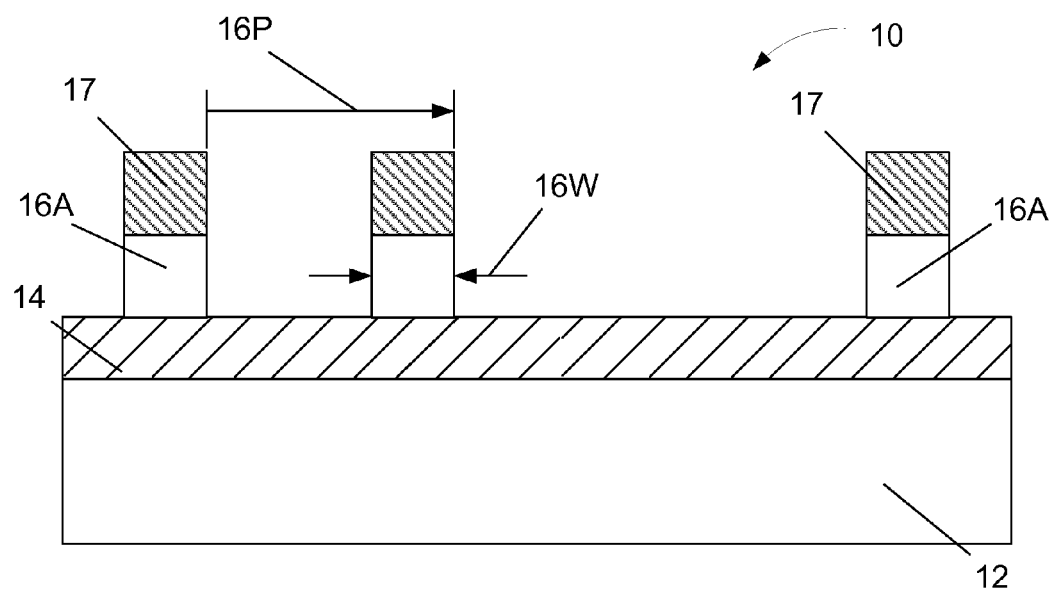
Figure 1C:
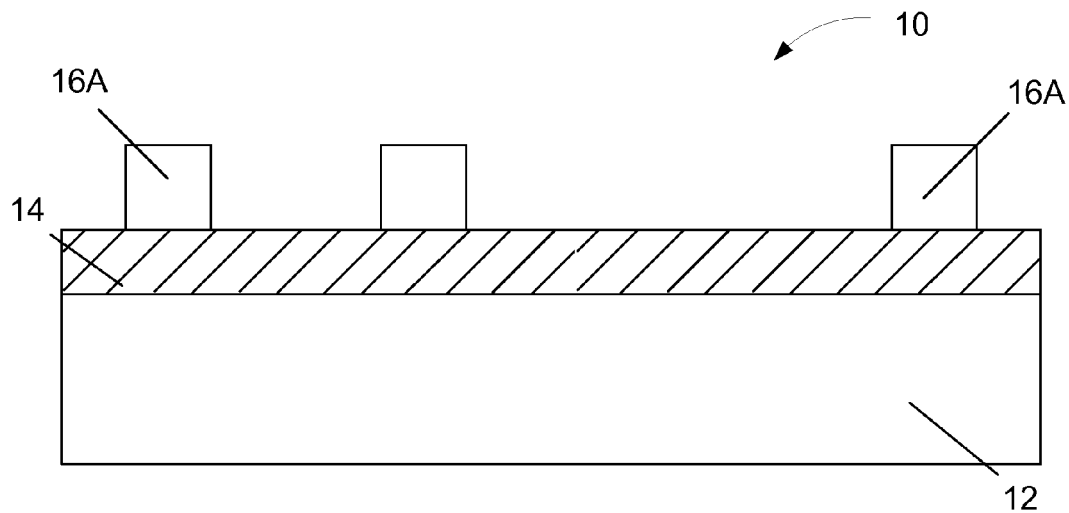
Figure 1D:
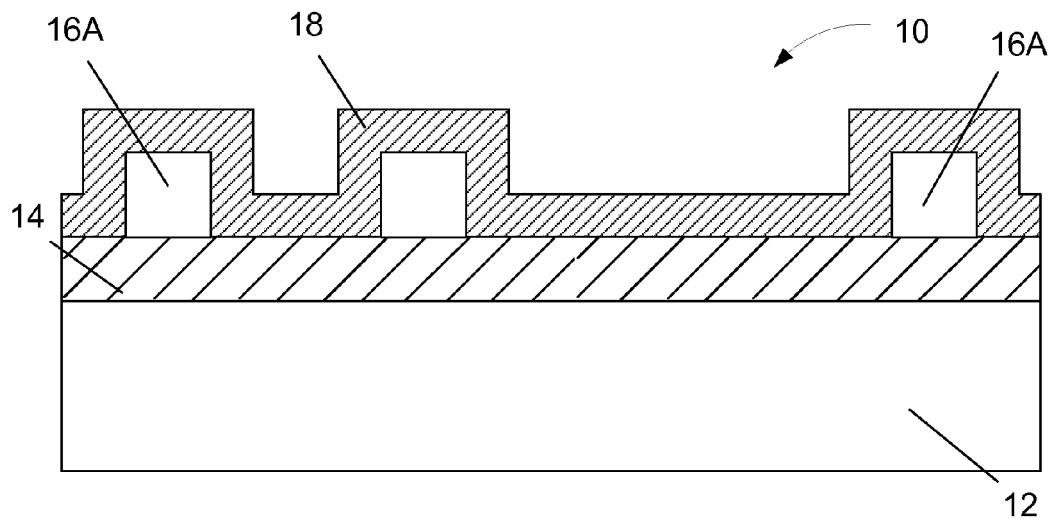
Figure 1E:
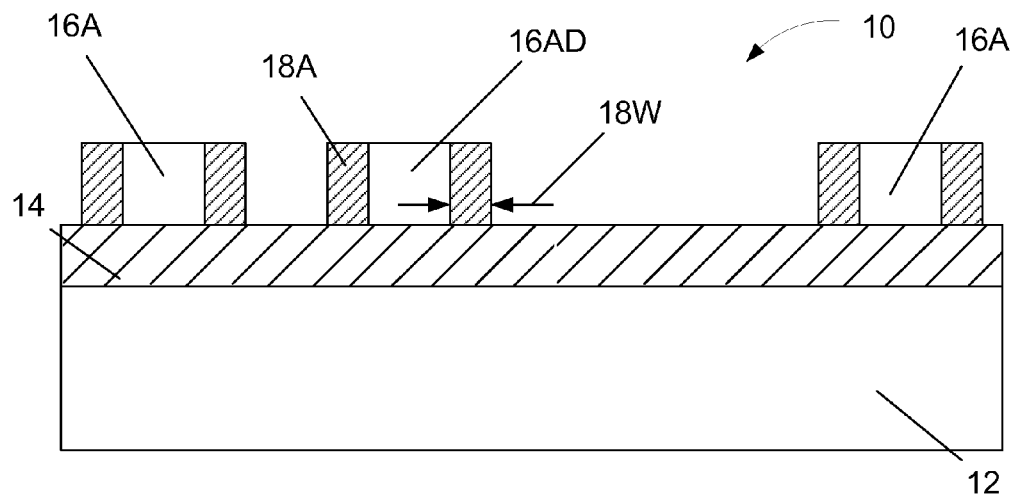
Figure 1F:
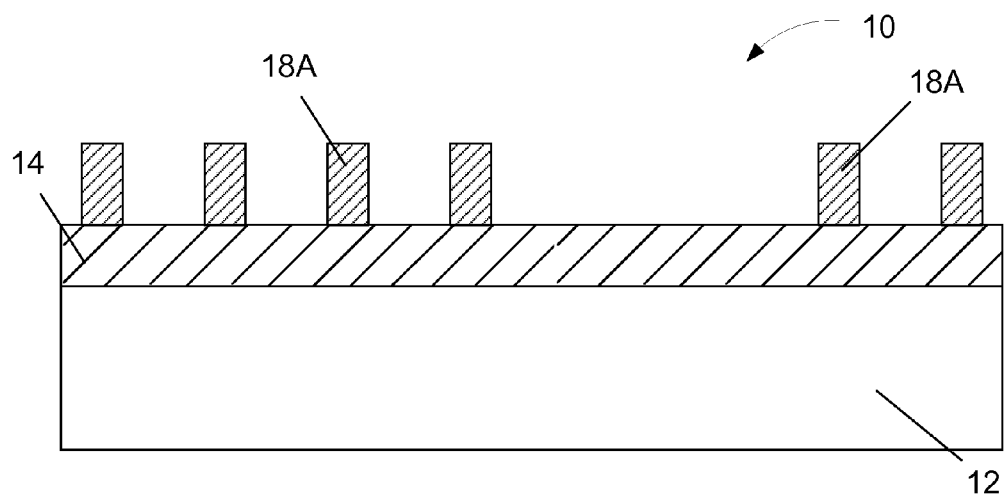
Figure 1G:
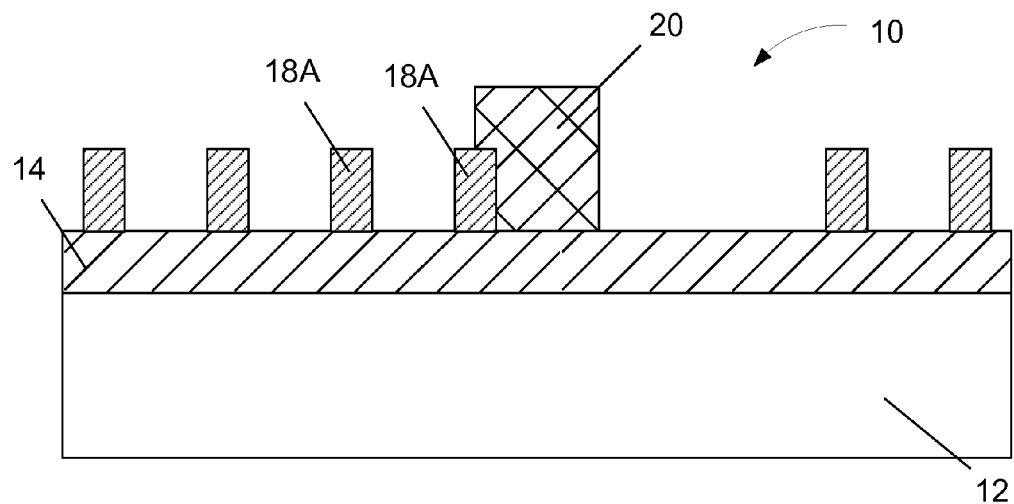
Figure 1H:
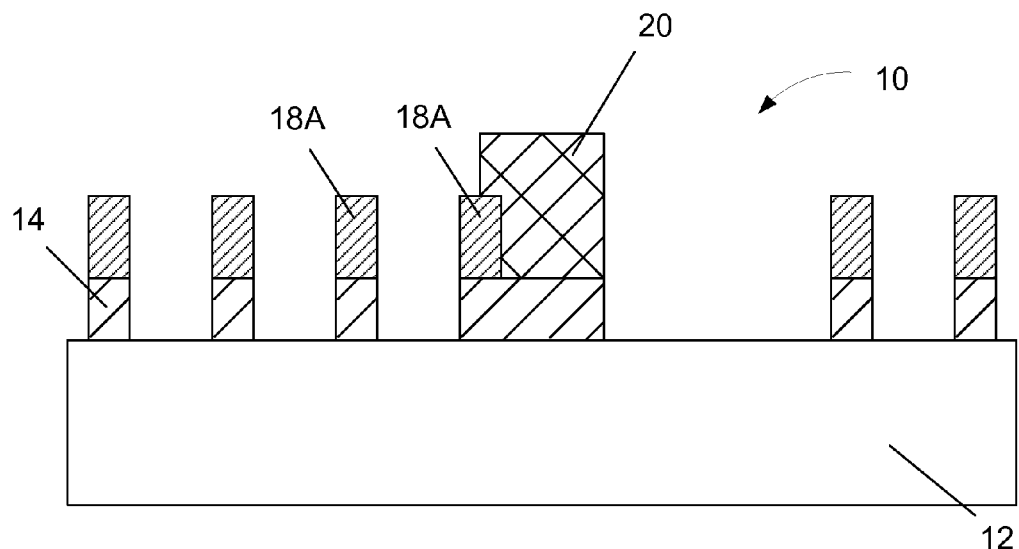
Figure 1I:
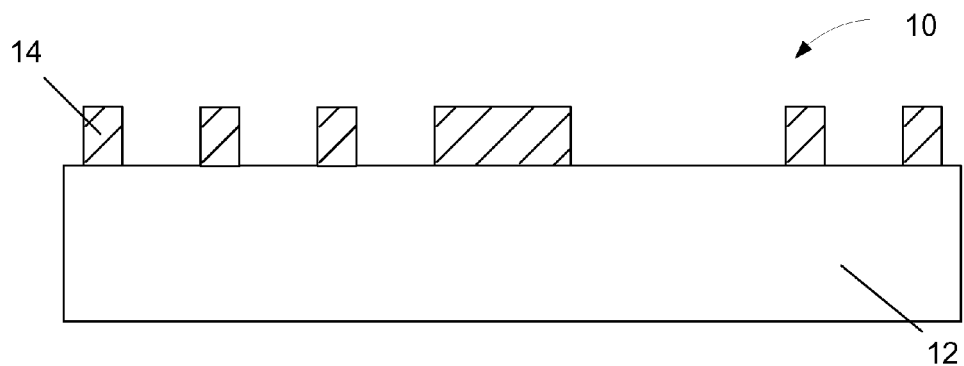
Figure 1J:
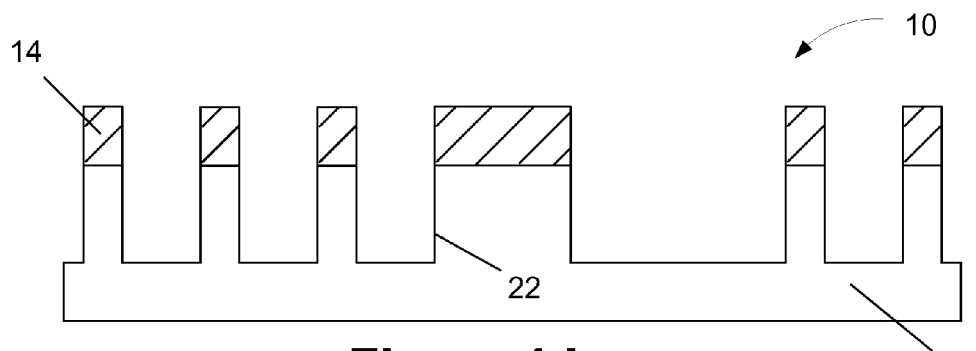
Figure 1K:
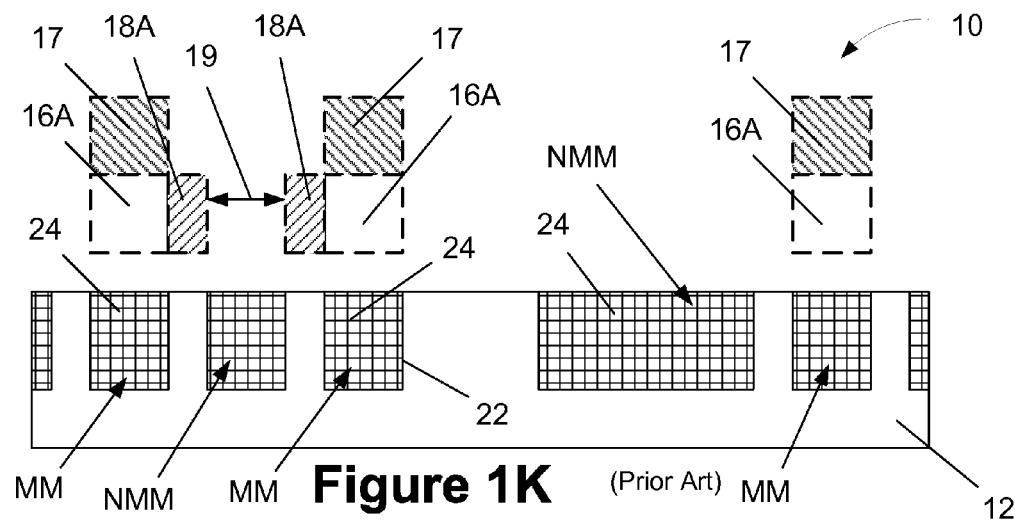
Figure 1L:
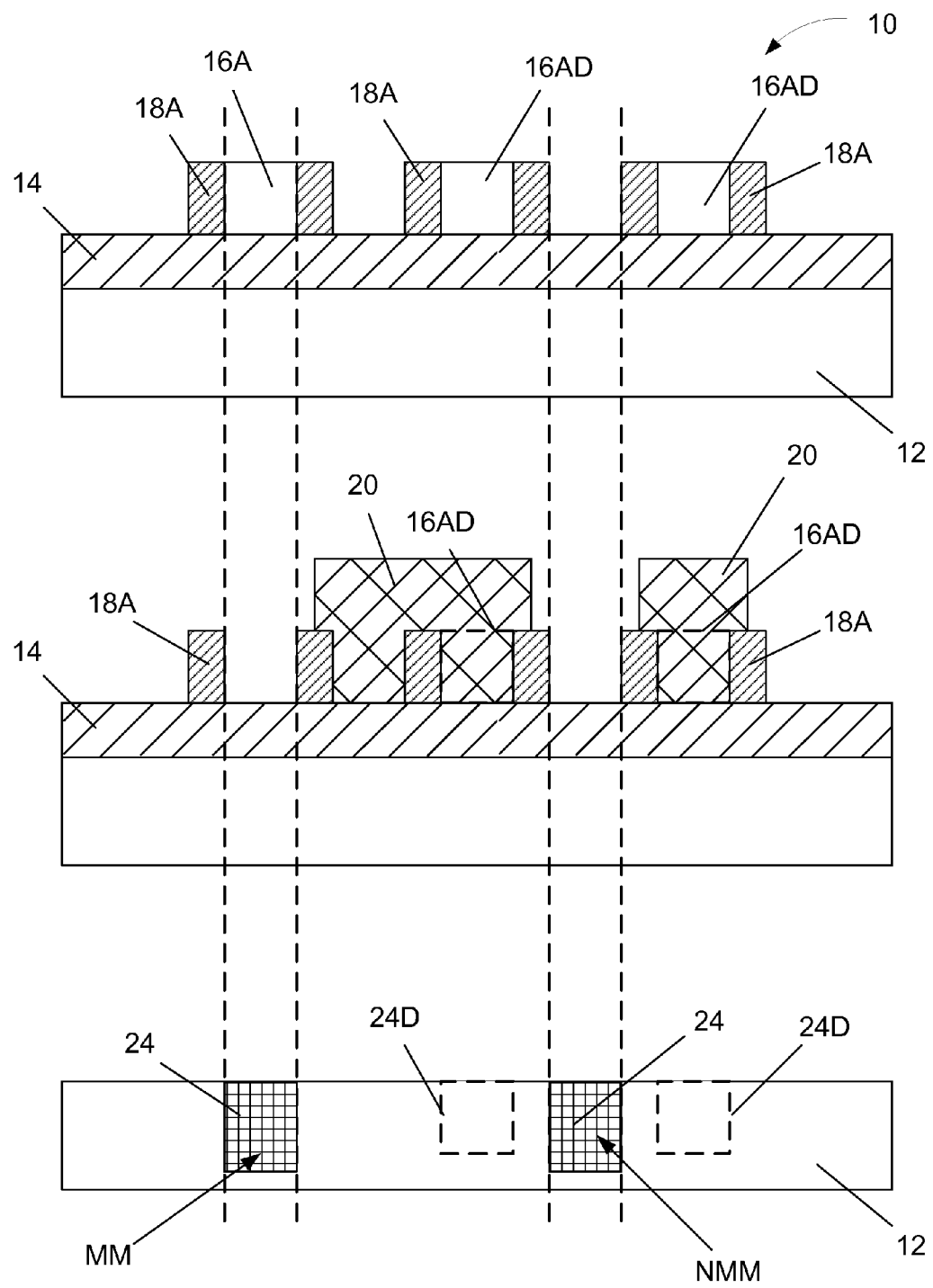
Figure 1N:
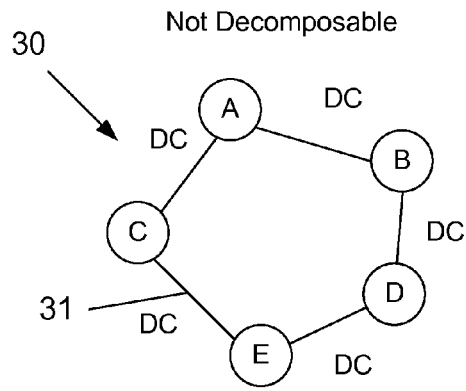
FIGS. 1N-1O depict illustrative examples of polygon loops and one example of resolving an odd-cycle conflict in an LELE process.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is generally directed to various methods disclosed herein of generating circuit layouts that are to be formed using self-aligned double patterning (SADP) routing techniques. As will be readily apparent to those skilled in the art upon a complete reading of the present application, the methods and devices disclosed herein may be employed in the fabrication of a variety of devices, such as logic devices, memory devices, ASICs, etc. With reference to the attached figures, various illustrative embodiments of the methods, devices and systems disclosed herein will now be described in more detail.

Figure 1O:
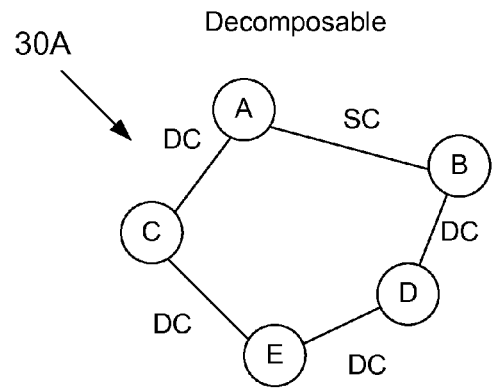

FIG. 5A-5F will be referenced to discuss various aspects of the inventions disclosed herein. Reference will also be made to certain aspects of the prior art process flow described in FIGS. 1A-1O as needed. As indicated in the background section of this application, in an SADP process, the features that are formed, e.g., metal lines, are either mandrel-metal features (MM) or non-mandrel-metal (NMM) features. As it relates to terminology used herein and in the attached claims, the MM features and NMM features are referred to as being different "colors" when it comes to decomposing an overall pattern layout that is to be manufactured using an SADP process technique. Thus, two MM features are said to be of the "same color," while an MM feature and an NMM feature are said to be of "different colors." Similarly, two NMM features are said to be of the "same color."

Figure 2:
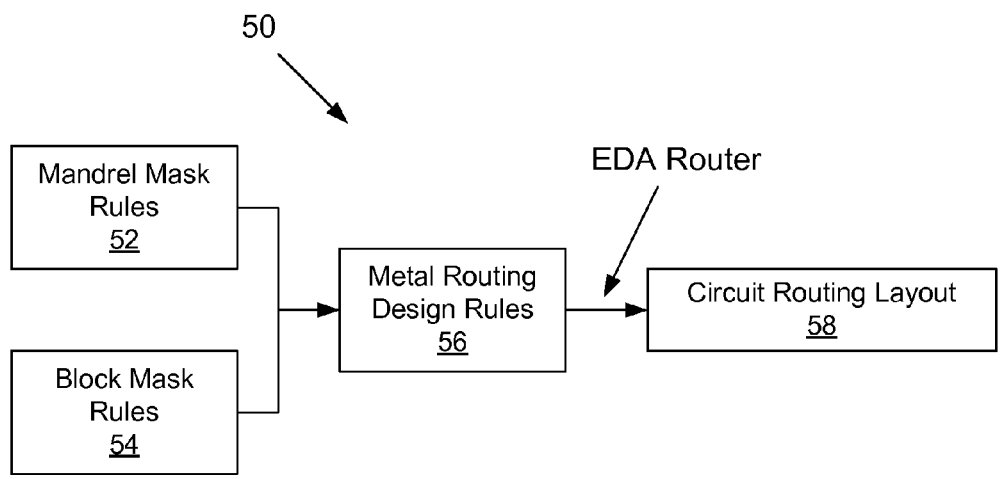
FIG. 2 depicts one illustrative example of a prior art metal routing process that is performed using EDA tools for generating a circuit routing layout that is intended to be manufactured using an SADP process.
Figure 3:
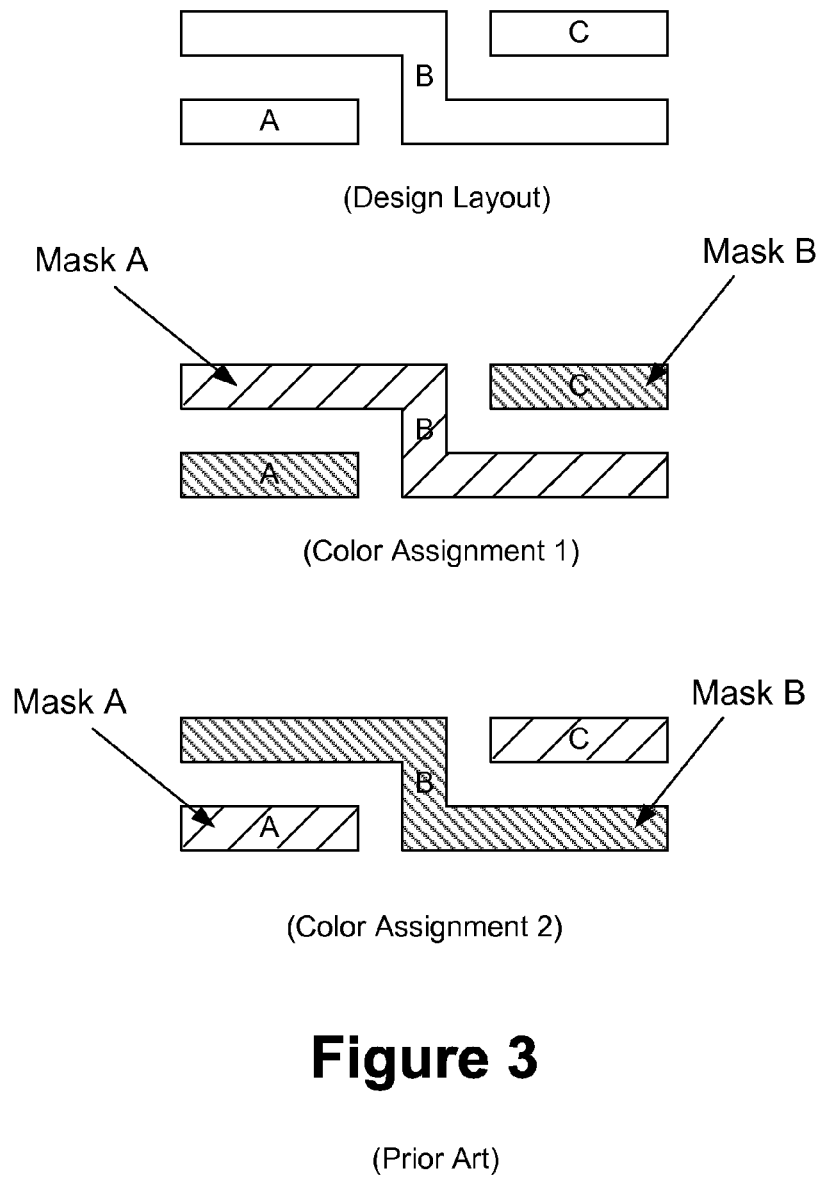
FIG. 3 depicts one illustrative example of a symmetrical prior art circuit layout that is to be manufactured using an LELE process.

In an SADP process, there are only two real-world, physical photomask layers employed—the mandrel mask and the block mask. Accordingly, as indicated in FIG. 2, prior art efforts focused on generating metal route design rules based upon the block mask 20 and the mandrel mask 17 for SADP route generation. However, as shown in the background section of this application, due to the non-color-symmetrical nature of the SADP process and the routing that focused on only the mandrel mask 17 and the block mask 20, color symmetrical circuit layouts cannot be achieved using traditional SADP circuit routing and decomposition rules and techniques. The inventors have discovered that by creating a virtual, i.e., non-physical, software-based non-mandrel-metal mask layer (hereinafter, a "virtual non-mandrel mask layer") using EDA software and incorporating that virtual non-mandrel mask layer (and rules associated therewith) into the EDA process, and particular the metal route design rule creation and decomposition aspects of the EDA process, color symmetry of circuit layouts may be achieved and a colorless SADP circuit routing solution may be obtained. According to one aspect of the various inventions disclosed herein, a virtual dummy non-mandrel pattern is used during the decomposition process to assure the color symmetry of the SADP decomposition process. The manner in which such software-based "layers" may be created and programmed into modern EDA tools and systems is well known to those skilled in the art.

Figure 5A:
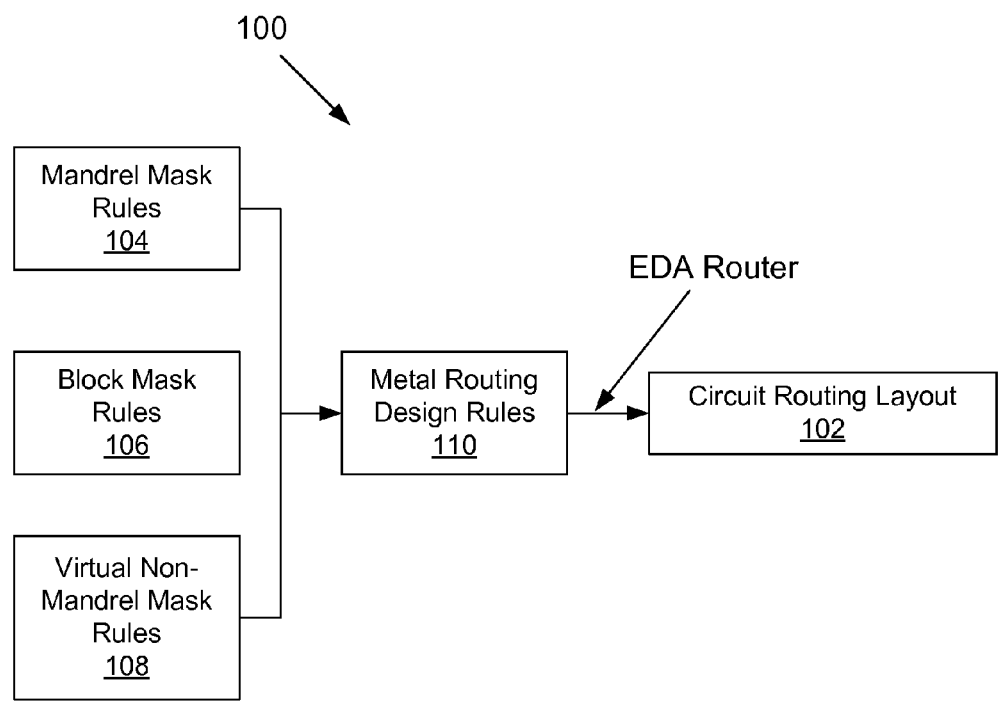
FIGS. 5A-5F depict various illustrative embodiments of various methods disclosed herein of generating circuit layouts using self-aligned double patterning (SADP) routing techniques.

FIG. 5A depicts one illustrative example of a metal routing process disclosed herein that involves use of rules associated with the virtual non-mandrel mask layer for generating a circuit routing layout 102 that is intended to be manufactured using an SADP process. As shown in FIG. 5A, the process begins with creating a set of mandrel mask rules, as indicated in block 104, and creating a set of block mask rules, as indicated in block 106. The mandrel mask rules and the block mask rules may be specific to a particular semiconductor manufacturing process and/or product. In general, the mandrel mask rules 104 and the block mask rules 106 establish, among other things, certain size and spacing limitations as it relates to the formation of features on both the mandrel mask and the block mask, while accounting for the limitations in photolithography tools and techniques.

According to one aspect of the presently disclosed inventions, various rules associated with the novel virtual non-mandrel mask layer disclosed herein are created and used as inputs to the creation of the metal routing design rules, as indicated in block 110, which are ultimately used in creating the final circuit routing layout 102. In one embodiment, the inventors selected the virtual non-mandrel mask rules 108 to be a 100% replica of mandrel mask rules referenced in block 104.

With continuing reference to FIG. 5A, based upon the mandrel mask rules, the block mask rules and virtual non-mandrel mask rules 108, the metal routing design rules are generated, as indicated in block 110. In general, the metal routing design rules set specifies certain geometric and spacing restrictions between adjacent features of the circuit layout, while accounting for variability in semiconductor manufacturing processes. Importantly, the metal routing design rules are generated and used to create the final circuit layout in an effort to insure that the final circuit layout can be decomposed into a mandrel mask and a block mask, each or which is compliant with the corresponding mask rules, while insuring color symmetry due to the incorporation of the virtual non-mandrel mask rules 108 in creating the metal routing design rules. With the metal routing rules established (in block 110), an EDA router is used to generate the circuit routing layout 102.

As discussed more fully below with respect to FIG. 5F, after the circuit routing layout 102 is generated, the circuit routing layout 102 is decomposed into a mandrel mask, a block mask and a dummy non-mandrel pattern. Thereafter, the mandrel mask, the block mask and the dummy non-mandrel pattern are subjected to appropriate DRC activities, which typically include an overall SADP metal design rule check, to insure that they are double-patterning-compliant and otherwise comply with all of the other design rules. If the mandrel mask, the block mask and the dummy non-mandrel pattern pass the aforementioned checks, the circuit layout 102 is declared to be both design-rule-compliant and double-patterning-compliant, and can be released to a mask manufacturer for manufacturing the masks that correspond to the mandrel mask and the block mask. Again, since the virtual non-mandrel mask layer is a software-based non-physical "mask," there is no requirement that a physical mask be manufactured that corresponds to the dummy non-mandrel pattern that was created based upon the virtual non-mandrel mask layer. To the extent that the decomposed layout, as reflected in the mandrel mask, the block mask and the dummy non-mandrel pattern, fails to pass any of the design rule checks mentioned above, the circuit layout 102 has been determined to have one or more conflicts that must be fixed to eliminate the situations that are causing circuit layout to fail the design rule checking indicated above. Such fixes may involve adjusting the spacing, position and/or location of one or more features of the circuit layout 102.

Figure 4A:
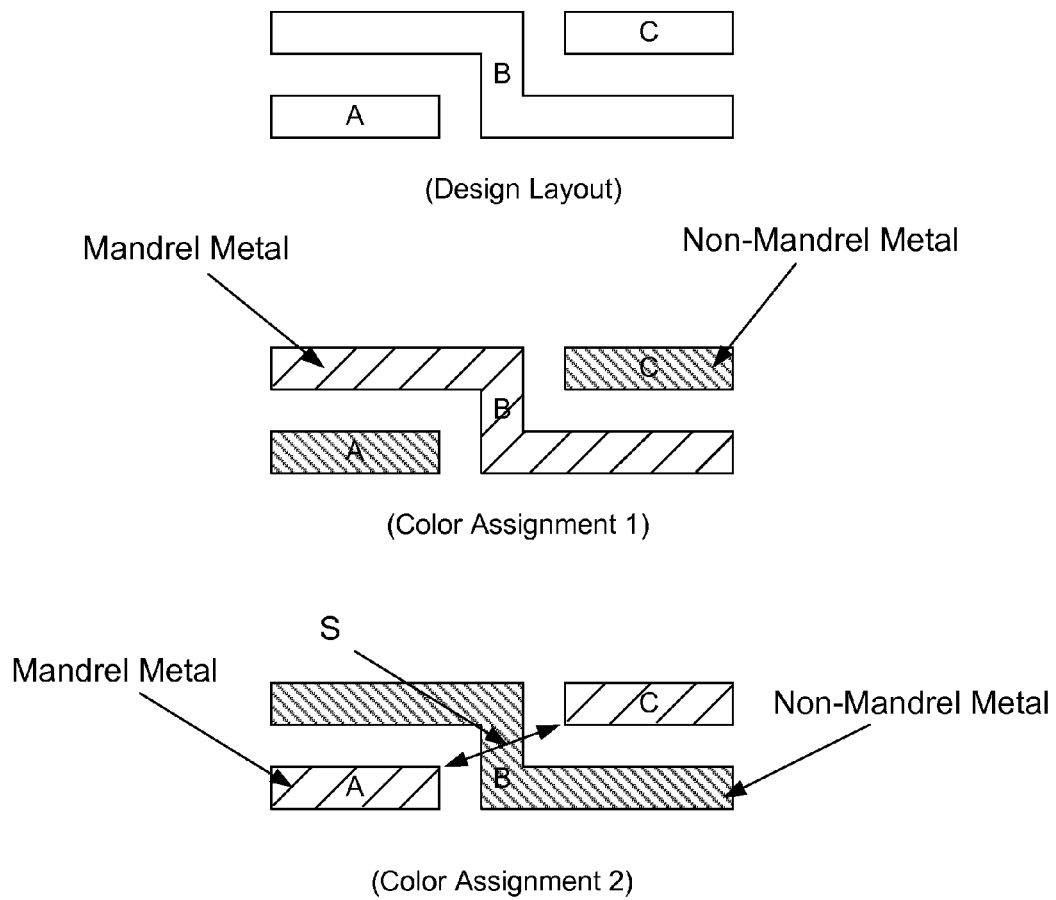
FIGS. 4A-4B depict illustrative examples of nonsymmetrical prior art layouts that are to be manufactured using an SADP process.
Figure 4B:
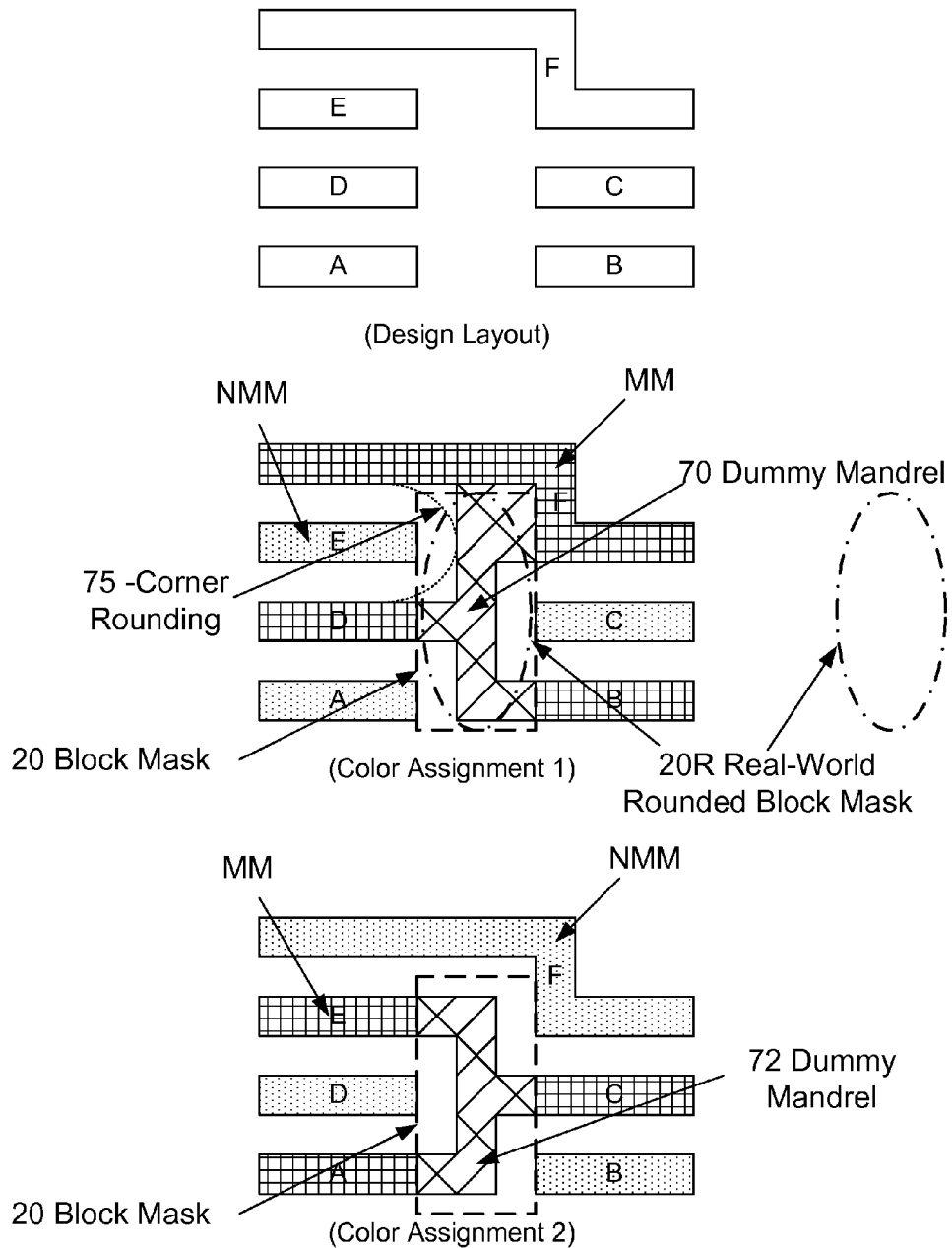
Figure 5B:
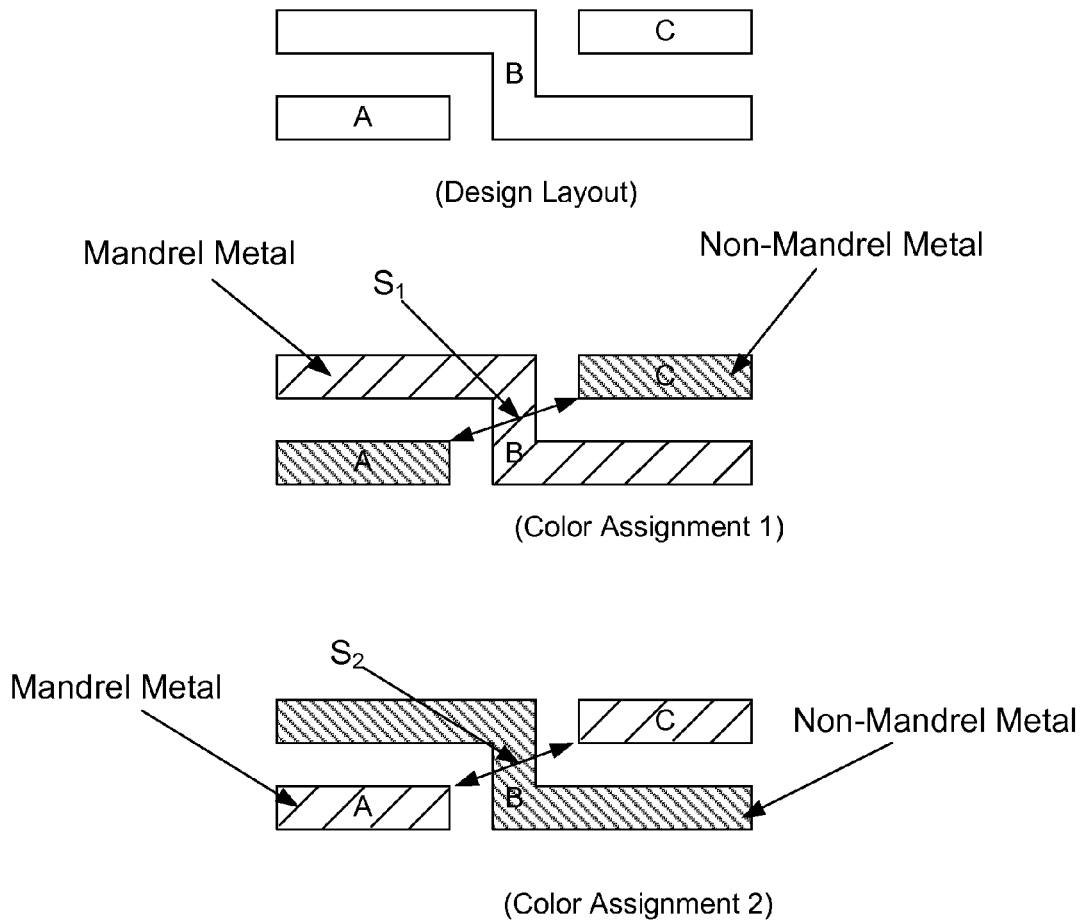

FIG. 5B depicts an example of a color symmetrical circuit layout that may be achieved using the methods disclosed herein. In one SADP coloring possibility ("Color Assignment 1"), the feature B is a mandrel-metal (MM) feature, while the features A and C are non-mandrel-metal (NMM) features. In another SADP coloring possibility ("Color Assignment 2"), the features A and C are MM features, while the feature B is an NMM feature. Unlike the prior art example depicted in FIG. 4A, according to the novel virtual non-mandrel mask rules 108 that is a replica of mandrel mask rules, the spacing $S_1$ between the non-mandrel-metal features A and C in the Color Assignment 1 solution is subject to the same design rule checking as the spacing S2 in the Color Assignment 2 solution. Accordingly, if the spacing ($S_1$ or $S_2$ since they are the same) is larger than the minimum mandrel spacing rules "S" (or equally the minimum non-mandrel spacing rule), both the Color Assignment 1 solution and the Color Assignment 2 solution are design-rule-compliant—i.e., DRC clean. If the spacing ($S_1$ or $S_2$ since they are the same) is less than the minimum mandrel spacing rules "S" (or equally the minimum non-mandrel spacing rule), both the Color Assignment 1 solution and the Color Assignment 2 solution are not design-rule-compliant—i.e., not DRC clean.

Figure 5C:
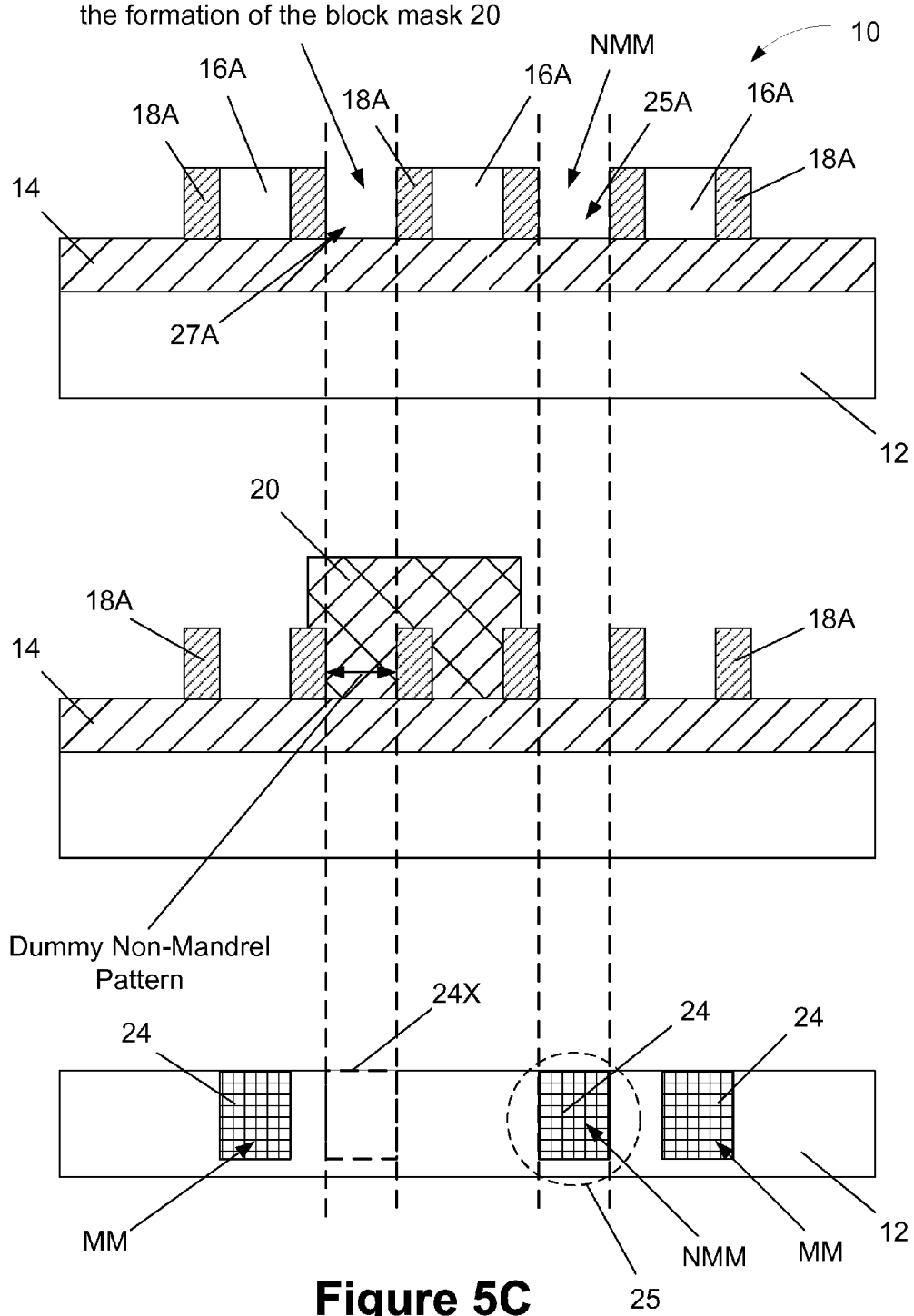

As it relates to the creation of the software-based virtual non-mandrel mask layer, those skilled in the art will appreciate that dummy non-mandrel-patterns (NMP) may be created using the same techniques as those described above with respect to the formation of dummy mandrel locations as described above. FIG. 5C is a sequence of cross-sectional drawings that will be referenced for purposes of explaining the concept of dummy non-mandrel-patterns. With reference to the lower drawing shown in FIG. 5C, a non-mandrel-metal (NMM) feature 24 (enclosed by the dashed-line circle 25) will be formed in the layer of insulating material 12. With reference to the upper drawing in FIG. 5C, that particular NMM feature 24 is formed in the space 25A between two adjacent spacers 18A that were formed on different mandrels 16A. Also depicted in the lower drawing in FIG. 5C are mandrel-metal (MM) features 24 that were formed in the space previously occupied by the mandrels 16A. At the point in the process flow depicted in the middle drawing in FIG. 5C, all of the original mandrels 16A have been removed, leaving only the spaced-apart spacers 18A. Also depicted in middle drawing is a portion of the block mask 20 that has been formed so as to cover a portion of the previously open NMM region 27A between the spaced-apart spacers 18A. Thus, this portion of the block mask 20 effectively blocks a portion of the non-mandrel-metal regions so as to form "dummy non-mandrel-patterns." As will be understood from the foregoing, a dummy non-mandrel-pattern is a portion of an original non-mandrel-metal region that will be blocked by a portion of the block mask 20. In the lower drawing in FIG. 5C, dashed lines 24X depict the location where a non-mandrel-metal (NMM) feature would have been formed if block mask 20 were not present.

Figure 5D:
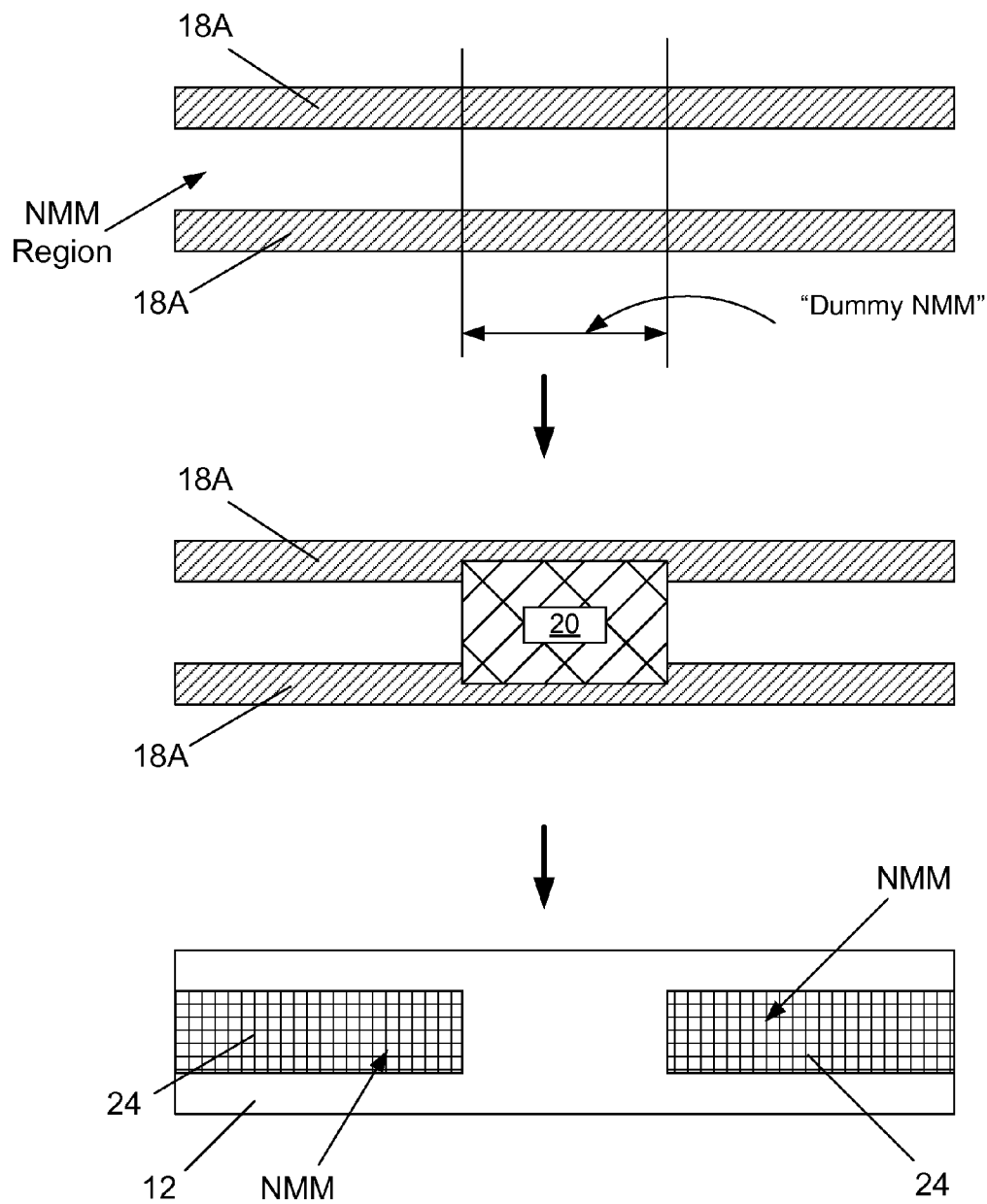

FIG. 5D is a sequence of plan-view drawings schematically depicting some of the steps involved in forming two illustrative non-mandrel-metal (NMM) features 24 (see bottom drawing) in the layer of insulating material 12. As depicted in the upper drawing in FIG. 5D, the non-mandrel-metal (NMM) features that will be formed in the layer of insulating material 12 will be formed in the "NMM region" between the two spaced-apart spacers 18A. As depicted, the NMM features are typically line-type features that may be of any desired axial length. In some cases, the non-mandrel-metal features may be formed so as to exhibit a "jogged-line" configuration. In general, as discussed above, a "dummy non-mandrel pattern" is a portion of an original non-mandrel-metal region that will be blocked by a portion of the block mask 20. The upper drawing in FIG. 5D depicts the point in the process flow wherein the spacers 18A have been formed and the original mandrel 16A has been removed. The hard mask layer 14 is not depicted in FIG. 5D. The middle drawing depicts the point in the process flow where the block mask 20 has been formed so as to cover a portion, but not all, of the NMM region. The bottom drawing depicts the device after the layer of insulating material 12 has been etched, the block mask 20 and the spacers 18A have been removed, the non-mandrel-metal (NMM) features 24 have been formed in the layer of insulating material 12 and after the hard mask 14 (not shown) has been removed. In this example, with reference to the upper drawing in FIG. 5D, the middle portion of the NMM region would be referred to as a "dummy non-mandrel pattern" while the remaining portions of the non-mandrel metal feature are still referred to as non-mandrel-metal features, because actual non-mandrel-metal features will be formed in those areas. That is, the block mask 20 effectively "cuts" what would otherwise become part of a non-mandrel-metal feature 24. Of course, the magnitude of the width and the pitch of the various mandrel-metal features and the non-mandrel-metal features referenced herein may vary depending upon the particular application, and these dimensions will likely decrease as device dimensions continue to shrink as technology advances. Thus, the present inventions should not be considered to be limited to any particular numerical range of such dimensions.

Figure 5E:
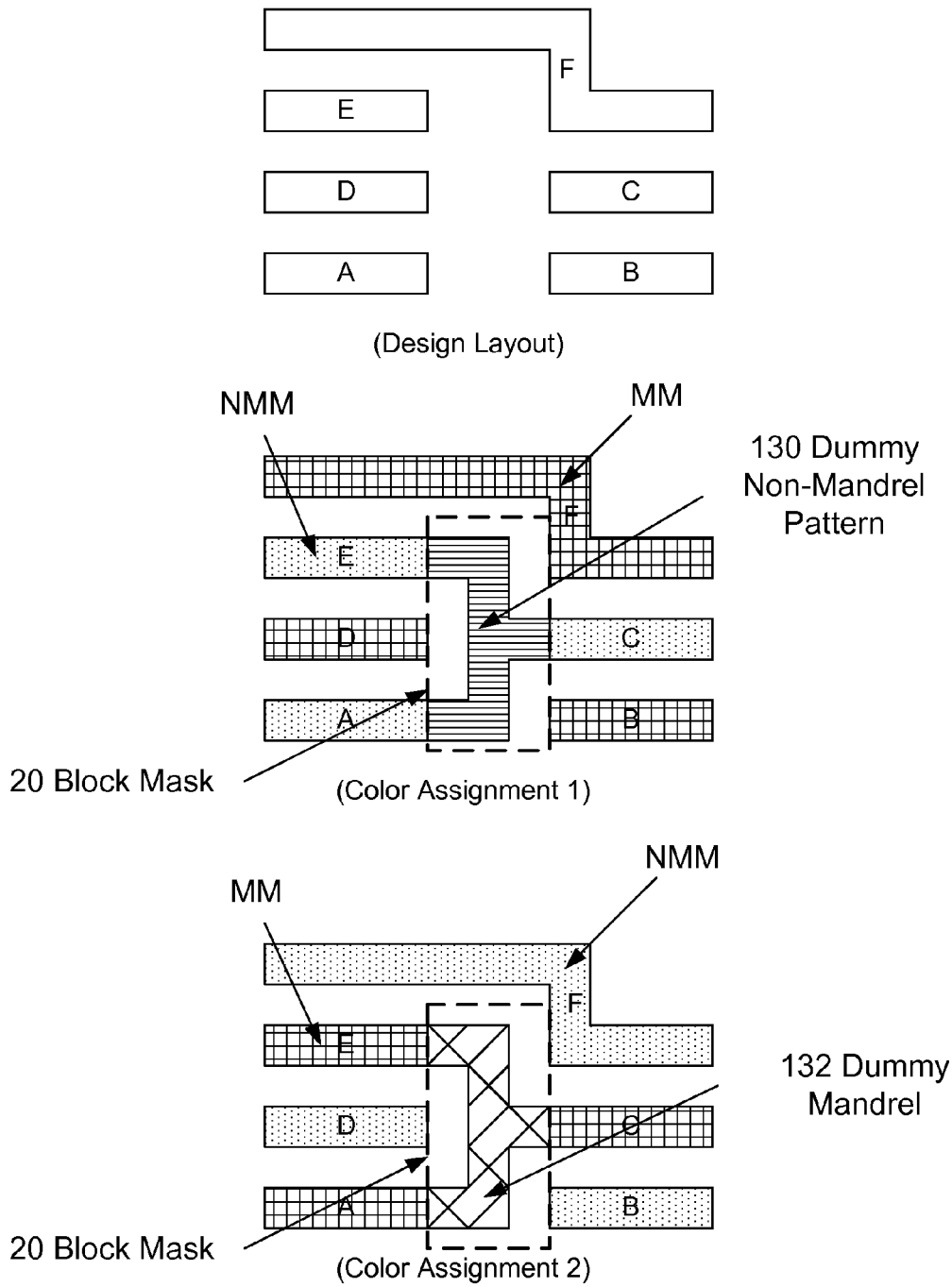

Using the concept of the virtual non-mandrel mask rules 108 and the methods disclosed herein, color symmetrical decomposition can be insured so that an SADP layout is truly color symmetrical and a colorless SADP route solution can be enabled. FIG. 5E depicts another example of such a color symmetrical layout to be manufactured using an SADP double patterning process. The overall circuit layout consists of six features (A-F). In one coloring possibility ("Color Assignment 1"), the features B, D and F are mandrel-metal (MM) features that are based upon the mandrel mask 17 (see FIG. 1A), while the features A, C and E are non-mandrel-metal NMM features. The location of the block mask 20 is also depicted in FIG. 5E. In accordance with one aspect of the present invention, the decomposition tool will generate the dummy non-mandrel pattern 130 depicted in FIG. 5E based upon the virtual non-mandrel mask rules. As indicated, the block mask 20 will be formed so as to effectively create the dummy non-mandrel pattern 130 by blocking the formation of non-mandrel-metal in the area covered by the block mask 20.

FIG. 5E also depicts another coloring possibility ("Color Assignment 2") for the overall circuit layout. In the "Color Assignment 2" embodiment, the features A, C and E are mandrel-metal (MM) features that are based upon the mandrel mask 17 (see FIG. 1A), while the features B, D and F are non-mandrel-metal NMM features. As indicated, the block mask 20 will be formed so as to effectively create the dummy mandrel pattern 132 by blocking the formation of mandrel-metal in the area covered by the block mask. The decomposition results depicted in the Color Assignment 1 and the Color Assignment 2 are completely equivalent in terms of design rule checking since, by the definition of the virtual non-mandrel mask rules, mandrel patterns and non-mandrel patterns are subject to the same design rule checking Thus, the overall circuit layout is "color symmetrical."

Figure 5F:
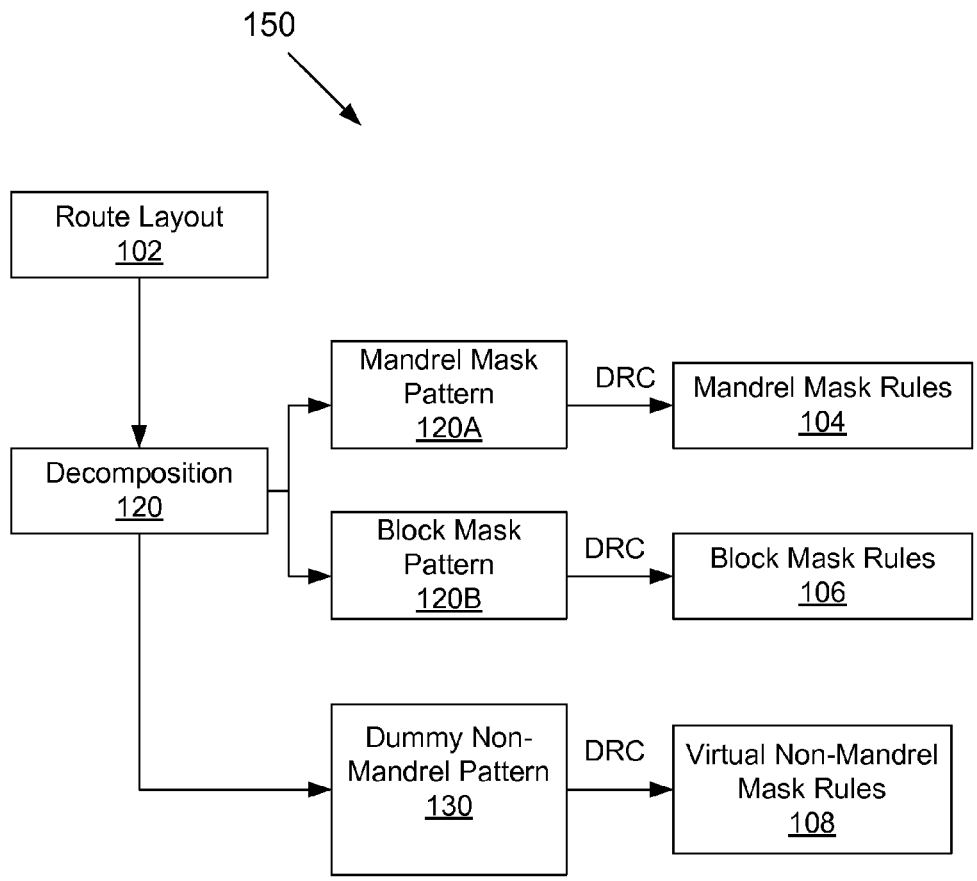

FIG. 5F depicts one illustrative example of an electronic design automation process and system 150 in accordance with one aspect of the inventions disclosed herein. As depicted therein, the system 150 is adapted for checking a circuit routing layout 102 that is intended to be manufactured using an SADP process to insure that the layout 102 is both design-rule-compliant and double-patterning-compliant using the methods disclosed herein. That is, the system 150 checks to make sure that the overall circuit layout 102 can be decomposed into a mandrel mask and block mask that contain circuit patterns that can be manufactured using the circuit manufacturer's tools and techniques. As shown in FIG. 5F, the initial layout 102 is decomposed in block 120 to generate a mandrel mask pattern 120A and a block mask pattern 120B. According to one aspect of the present invention, at the point of decomposition, the decomposition tool also generates a dummy non-mandrel pattern 130 that complies with the software-based virtual non-mandrel mask rules 108. With continuing reference to FIG. 5F, the mandrel mask pattern 120A is checked for compliance with the above-described mandrel mask rules 104. The block mask pattern 120B is checked for compliance with the above-described block mask rules 106. The dummy non-mandrel pattern 130 is also checked for compliance with the above-described virtual non-mandrel mask rules 108. The design rule checking of the mandrel mask 120A, the block mask 120B and the dummy non-mandrel pattern 130 may be performed in any order.

To the extent the mandrel mask 120A, the block mask 120B and dummy non-mandrel pattern 130 passes all of the design rule checking indicated in FIG. 5F, the circuit layout 102 is declared to be both design-rule-compliant and double-patterning-compliant, i.e., DRC clean, and can be released to a mask manufacturer for manufacturing the masks that correspond to the mandrel mask pattern 120A and the block mask pattern 120B. Again, since the dummy non-mandrel pattern 130 is a software-based non-physical "mask," there is no requirement that a physical mask be manufactured that corresponds to the dummy non-mandrel pattern 130. To the extent that the decomposed layout, as reflected in the mandrel mask pattern 120A, the block mask pattern 120B or the dummy non-mandrel pattern 130, fail to pass any of the design rule checks indicated in FIG. 5F, the circuit layout 102 has been determined to have one or more potential non-double-patterning-compliant patterns or layouts that must be fixed to eliminate the situations that are causing the circuit layout to fail the design rule checking indicated in FIG. 5F. After fixing the non-compliant aspects of circuit layout 102, a new (or modified) circuit layout is generated.

The techniques disclosed herein are in stark contrast to the methods employed in the prior art SADP design rule automation processes discussed in the background section of this application. More specifically, by introducing the use of the novel software-based virtual non-mandrel mask layer and the dummy non-mandrel pattern 130 disclosed herein into the EDA process, and in particular the design rule creation and decomposition aspects of the EDA process, color symmetry of circuit layouts may be achieved and a colorless SADP circuit routing solution may be obtained. In turn, this makes the fabrication of integrated circuits less cumbersome and more efficient in that the normal process operations of "coloring" a circuit layout and thereafter resolving any coloring conflicts may be avoided or at least reduced in the routing process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of generating a circuit routing layout for an integrated circuit that is to be manufactured using a self-aligned double patterning process (SADP), the method comprising:
    generating a set of mandrel mask rules;
    generating a set of block mask rules;
    generating a set of virtual non-mandrel mask rules;
    generating a set of metal routing design rules based upon said mandrel mask rules, said block mask rules and said virtual non-mandrel mask rules; and
    generating said circuit routing layout based upon said metal routing design rules.

2. The method of claim 1, further comprising:
    decomposing said circuit routing layout into a mandrel mask pattern, a block mask pattern and a dummy non-mandrel pattern;
    generating a first set of mask data corresponding to said mandrel mask pattern; and
    generating a second set of mask data corresponding to said block mask pattern.

3. The method of claim 2, further comprising providing said first and second sets of mask data to a mask manufacturer.

4. The method of claim 3, further comprising manufacturing integrated circuit products using masks obtained from said mask manufacturer, wherein said masks were based upon said first and second sets of said mask data.

5. The method of claim 1, wherein said virtual non-mandrel mask rules comprise a replica of said mandrel mask rules.

6. The method of claim 1, wherein generating said circuit routing layout based upon said metal routing design rules comprises generating said circuit routing layout by using a colorless routing solution that is based upon said metal design rules.

7. A method of generating a circuit routing layout for an integrated circuit that is to be manufactured using a self-aligned double patterning process (SADP), the method comprising:
    generating a set of mandrel mask rules;
    generating a set of block mask rules;
    generating a set of virtual non-mandrel mask rules, wherein said virtual non-mandrel mask rules comprise a replica of said mandrel mask rules;
    generating a set of metal routing design rules based upon said mandrel mask rules, said block mask rules and said virtual non-mandrel mask rules;
    generating said circuit routing layout based upon said metal routing design rules;
    decomposing said circuit routing layout into a mandrel mask pattern, a block mask pattern and a dummy non-mandrel pattern;
    generating a first set of mask data corresponding to said mandrel mask pattern; and
    generating a second set of mask data corresponding to said block mask pattern.

8. The method of claim 7, further comprising providing said first and second sets of mask data to a mask manufacturer.

9. The method of claim 8, further comprising manufacturing integrated circuit products using masks obtained from said mask manufacturer, wherein said masks were based upon said first and second sets of said mask data.

10. A method of generating a circuit routing layout for an integrated circuit that is to be manufactured using a self-aligned double patterning process (SADP), the method comprising:
    generating a virtual, software-based non-mandrel mask;
    generating a set of virtual non-mandrel mask rules;
    generating a set of metal routing design rules based upon at least said virtual non-mandrel mask rules; and
    generating said circuit routing layout based upon said metal routing design rules.

11. The method of claim 10, further comprising:
    decomposing said circuit routing layout into a mandrel mask pattern and a block mask pattern;
    generating a first set of mask data corresponding to said mandrel mask pattern;
    generating a second set of mask data corresponding to said block mask pattern; and providing said first and second sets of mask data to a mask manufacturer.

12. The method of claim 10, wherein the method further comprises generating a set of mandrel mask rules and wherein said virtual non-mandrel-metal mask rules comprise a replica of said mandrel mask rules.

* * * * *